United States Patent
Doty

[19]
[11] Patent Number: 6,054,857
[45] Date of Patent: Apr. 25, 2000

[54] NMR MAS SEALING SAMPLE CELLS AND METHODS

[75] Inventor: F. David Doty, Columbia, S.C.

[73] Assignee: Doty Scientific, Inc., Columbia, S.C.

[21] Appl. No.: 09/044,686

[22] Filed: Mar. 18, 1998

Related U.S. Application Data

[60] Provisional application No. 60/039,348, Mar. 18, 1997.

[51] Int. Cl.$^7$ ........................................... G01V 3/00
[52] U.S. Cl. ................................................... 324/321
[58] Field of Search ..................... 324/320, 321, 324/322

[56] References Cited

U.S. PATENT DOCUMENTS

| | | | |
|---|---|---|---|
| 4,254,373 | 3/1981 | Lippmaa | 324/321 |
| 4,456,882 | 6/1984 | Doty | 324/321 |
| 4,511,841 | 4/1985 | Bartuska | 324/321 |
| 4,654,592 | 3/1987 | Zens | 324/307 |
| 4,739,270 | 4/1988 | Daugaard | 324/321 |
| 4,940,942 | 7/1990 | Bartuska | 324/321 |
| 5,202,633 | 4/1993 | Doty | 324/321 |
| 5,325,059 | 6/1994 | Doty | 324/321 |
| 5,333,994 | 8/1994 | Doty et al. | 415/202 |
| 5,508,615 | 4/1996 | Doty | 324/321 |

OTHER PUBLICATIONS

T.M. Barbara, "Cylindrical Demagnetization Fields and Microprobe Design in High–Resolution NMR," *J. Magn. Reson. Ser. A,* 109, pp. 265–269, 1994.

A. Bielecki and D.P. Burum, "Temperature Dependence of $^{207}$Pb MAS for VT MAS Spectra of Solid Lead Nitrate. An Accurate, Sensitive Thermometer for VT MAS," *J. Magn. Reson. Ser. A,* vol. 116, pp. 215–220, 1995.

F.D. Doty, "Solid State NMR Probe Design," *Encyclopedia of NMR,* vol. 7, Wiley Press, 1996.

P.A. Keifer, L. Baltusis, D.M. Rice, A.A. Tymiak, and J. N. Shoolery, "A Comparison of NMR Spectra Obtained for Solid–Phase–Synthesis Resins Using Conventional High–Resolution, MAS, and HR–MAS Probes," *J. Magn. Reson. Ser. A,* vol. 119, pp. 65–75, 1996.

P.A. Keifer, "Influence of Resin Structure, Tether Length, and Solvent Upon the High Resolution $^1$H NMR Spectra of Solid–Phase–Synthesis Resins," in *J. Org. Chem.,* vol. 61, pp. 1558–1559, 1996.

*Primary Examiner*—Christine K. Oda
*Assistant Examiner*—Tiffany A. Fetzner
*Attorney, Agent, or Firm*—Oppedahl & Larson LLP

[57] ABSTRACT

A cylindrical NMR sample cell is made from a first plastic material having Young's modulus $Y_1$, tensile strength $S_1$, and density $p_1$ with precision outside diameter (OD) $d_4$, wherein the outside diameter fits inside a ceramic NMR MAS rotor having modulus $Y_3$ and density $p_3$. The sample cell comprising a sample chamber with a concentric cylindrical opening at one end having inside diameter $d_2$. A cylindrical plug is made from a second plastic material having modulus $Y_2$, strength $S_2$, and density $p_2$ with plug outside diameter $d_1$ to fit firmly inside the mouth of the cell, so as to seal the sample of density $p_4$ inside the cell with inside cell diameter $d_3$ when stationary and to seal when spinning at a high rate of speed inside the ceramic rotor. More-over, the following materials properties and relationships are satisfied: $Y_1 > 0.8$ GPa, $Y_1 < 4$ GPa, $Y_2 < 3.4$ GPa, $S_1 > 8$ MPa, $S_2 > 3$ MPa, $p_2 > 880$ kg/m$^3$, $p_2 > p_4$, $Y_3 > Y_2 > Y_1$, and $p_2/Y_2 > p_1/Y_1$. A dual-chamber cell is also disclosed to facilitate external lock.

24 Claims, 1 Drawing Sheet

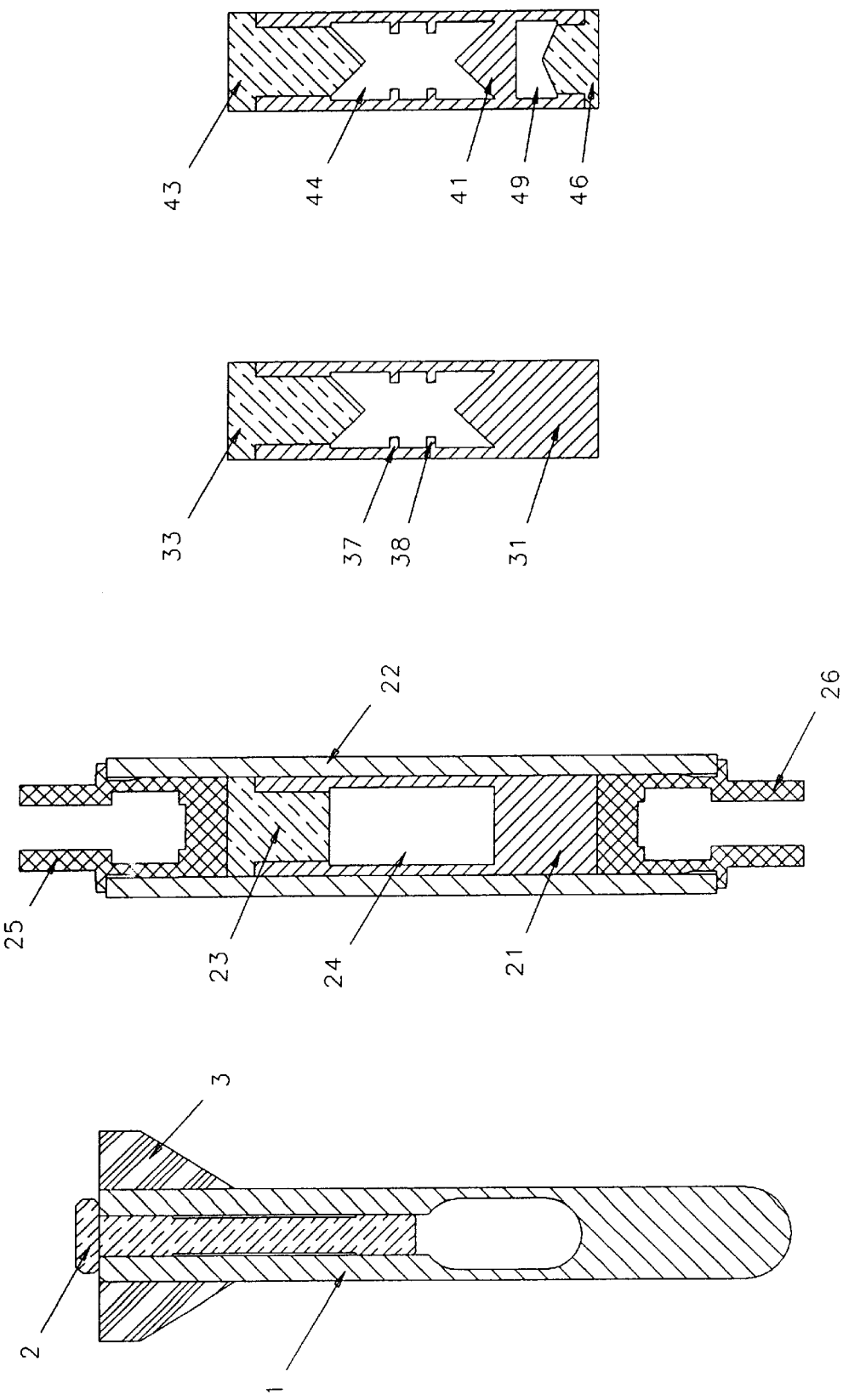

6,054,857

NMR MAS SEALING SAMPLE CELLS AND METHODS

RELATED APPLICATIONS

This application claims priority from pending U.S. Provisional Application Ser. No. 60/039,348 filed on Mar. 18, 1997, which is hereby incorporated by reference.

FIELD OF THE INVENTION

The field of this invention is the measurement of nuclear magnetic resonance (NMR) for the purpose of determining molecular or microscopic structure, and, more particularly, novel sample cells for NMR Magic Angle Spinning (MAS) on liquid or semi-solid samples.

BACKGROUND OF THE INVENTION

There have been numerous applications of Magic Angle Spinning (MAS) for line narrowing in solid samples for more than two decades. The solid sample is usually contained in a hard ceramic rotor with press-fit turbine caps machined from high-strength high-modulus plastics such as polymides, although softer plastics such as Kel-F (poly-$CCIF_3$, the highest strength non-protonated plastic available) are used when it is necessary to minimize $^1H$ or $^{13}C$ background signals—see for example, U.S. Pat. No. 5,508,615 by Doty et al (note the extensive list of typographical corrections). For high-temperature applications, the sample is usually contained in a soft boron-nitride cell inside a hard ceramic rotor, as disclosed by Doty et al in U.S. Pat. No. 5,202,633. The limited MAS applications to liquids prior to 1993 generally utilized viton o-rings in either ceramic or plastic turbine caps inside hard ceramic rotors, as shown by Daugaard et al in U.S. Pat. No. 4,739,270, although press-fit kel-f plugs inside ceramic rotors have also been used and found to seal well when the rotor inside diameter (D) is highly polished.

A number of recent publications describe extensive new applications of MAS to liquid and semi-solid samples—see for example, 'A Comparison of NMR Spectra Obtained for Solid-Phase-Synthesis Resins Using Conventional High-Resolution, MAS, and HR-MAS Probes', in *J. Magn. Reson. Ser. A*, vol. 119, pp. 65–75, 1996, by Paul A. Keifer et al, and 'The influence of Resin Structure, Tether Length, and solvent upon the High-Resolution $^1H$ NMR Spectra of Solid-Phase-Synthesis Resins', in *J. Org. Chem.*, vol. 61, pp. 1558–1559, 1996, by Paul A. Keifer. The referenced work utilizes a sample cell by Vrian NMRI (Palo Alto, Calif.), as shown in FIG. 1, capable of spinning between approximately 1000 and 3000 Hz. It uses a glass rotor tube 1 with a teflon plug 2 and polyimide conical drive turbine 3. While the seal is quite effective, the spinner design does not work well above 3 kHz, and the samples must be loaded through a syringe, which is not convenient for many types of semi-solids. A copending patent application discloses some methods of achieving the high $B_0$ homogeneity in the spinner assembly needed for high resolution (HR) MAS with liquids. Another copending patent application describes novel lock coils for high resolution, another discloses novel NMR susceptibility plugs, and yet another discloses novel transverse coil geometries.

The semi-solids MAS applications stem largely from the fact that spinning a cylindrically symmetric sample at the magic angle averages susceptibility discontinuities to zero. Hence, high resolution may be obtained with magnetically inhomogeneous samples, such as tissues and semi-solids, and the discontinuity at the sample-cell boundary is inconsequential, obviating the need for susceptibility matching. This is particularly important for applications with limited samples.

The MAS o-ring seal fails (at its minor diameter) above a critical speed that is a function of sample density, o-ring density, o-ring compression, and diameter. For 5 mm rotors, the maximum speed is usually in the range of 5 to 8 kHz, corresponding to centrifugal sample fluid pressures in the range of 12 to 50 bar. On the other hand, solid polymeric plugs, such as teflon or kel-f, generally maintain a fluid-tight seal without o-rings up to the maximum speed the ceramic rotor will tolerate (often 12 to 20 kHz for 5 mm MAS rotors) as long as the fluid density is less than the density of the polymeric plug and the temperature is not far below room temperature. However, ceramic or glass MAS rotors with turbine caps and sealing closures of the prior art are somewhat difficult to load/unload and are quite expensive—typically in the range of $250 to $900 each.

Another approach in a variety of designs over the past 40 years in an all-plastic rotor—see, for example, Bartuska et al in U.S. Pat. No. 4,511,841. Often the parts have been threaded for a screw-together cell. Other designs have used press-fit parts or sealed glass tubes inside ceramic rotors. None of these approaches is satisfactory for sealing liquids in a high speed spinner. First of all, the modulus of a kel-f rotor is too low to maintain the required precision for high-speed spinning. But even before this spinning limitation is reached, the cells leak, as the outer plastic shell stretches away from what ever type of seal is designed. Spinning of 5 mm kel-f rotors inside stiff gas bearings is generally limited to less than 5 kHz, but sealing often fails below 3 kHz. Numerous plastics are available with much higher strength and modulus and thus permit higher spinning speeds—at least up to 10 kHz. However, sealing is often more difficult because of the lack of compliance, and, because of their backgrounds, such plastics are useless for the primary application of HR NMR—proton NMR.

An important new application of HR MAS is in combinatorial chemistry, where it is often desirable to maintain thousands of prepared samples that can easily be loaded into an MAS probe, spun up to at least 6 kHz (sometimes even 18 kHz is needed), easily removed without contamination, and stored for years in sealed cells for later analysis by other methods. The sample cells disclosed herein satisfy this and other needs and are more than an order of magnitude less expensive than the prior art ceramic cells.

SUMMARY OF THE INVENTION

A cylindrical NMR sample cell is made from a first plastic material having Young's modulus $Y_1$, tensile strength $S_1$, and density $p_1$ with precision outside diameter (OD) $d_4$, wherein the outside diameter fits inside a ceramic NMR MAS rotor having modulus $Y_3$ and density $p_3$. The sample cell comprising a sample chamber with a concentric cylindrical opening at one end having inside diameter $d_2$. A cylindrical plug is made from a second plastic material having modulus $Y_2$, strength $S_2$, and density $p_2$ with plug outside diameter $d_1$ to fit firmly inside the mouth of the cell, so as to seal the sample of density $p_4$ inside the cell (with inside cell diameter $d_3$) when stationary and to seal when spinning at a high rate of speed inside the ceramic rotor. More-over, the following materials properties and relationships are satisfied: $Y_1>0.8$ GPa, $Y_1<4$ GPa, $Y_2<3.4$ GPa, $S_1>8$ MPa, $S_2>3$ MPa, $p_2>880$ kg/m$^3$, $p_2>p_4$, $Y_3>Y_2Y_1$, and $p_2/Y_2>p_1/Y_1$. A dual-chamber cell is also disclosed to facilitate external lock.

BRIEF DESCRIPTION OF THE DRAWINGS

FIG. 1 is a section view of a prior-art HR MAS spinner for liquids and semi-solids.

FIG. 2 is a cross sectional view showing the sealing cell inside the ceramic rotor.

FIG. 3 is a cross sectional view of a plastic MAS cell with a pointed plug.

FIG. 4 is a cross sectional view of a dual-chamber MAS cell for external lock.

DETAILED DESCRIPTION OF THE PREFERRED EMBODIMENT

FIG. 2 illustrates the use of a plastic cell 21 inside a ceramic (rotor) shell 22 according to the present invention. A plastic plug 23 seals the sample 24 inside the plastic cell. The ceramic shell 22 is driven by plastic turbine caps 25, 26 much like the prior art supersonic cell for solid samples. Reliable sealing and high-speed spinning are accomplished by a judicious choice of materials. The ceramic shell is normally either of partially stabilized zirconia (PSZ) or Hot-Isostatic-Pressed (HIP'd) silicon nitride ($Si_3N_4$), although sapphire ($Al_2O_3$) may be selected when transparency is needed. For proton NMR, the turbine caps and cell are normally of kel-f, although in some cases the turbine caps may be far enough from the active coil region to be made from a polyimide to permit faster spinning.

The ceramic shell must be manufactured to precision tolerances for satisfactory spinning-typical outside diameter (OD) tolerances are about 3 $\mu$m (microns), but concentricity must be within 1.0 $\mu$m and surface finishes must be under 0.2 $\mu$m. Thus, the inside diameter may be held to nominal tolerances of several microns without cost penalty. The kel-f cell is made to a precision slip fit inside the ceramic shell-typically, its nominal outside diameter $d_4$ is about 15 $\mu$m less than the nominal inside diameter $d_5$ of the ceramic shell, such that $d_5-d_4$ is positive and less than 50 $\mu$m, although clearances twice that large do not usually prevent stable spinning. In one embodiment, $d_5-d_4$ is approximately 15 $\mu$m. Sealing is then readily accomplished if the press-fit plug 23 has ratio of Young's modulus to density, $Y_2/p_2$, substantially less than that of the cell 21, $Y_1/p_1$, and if its density $p_2$ is greater than the sample 24 density $p_3$, and if the interference fit (compression) between the plug and the cell is greater than the clearance between the cell OD and the ceramic shell, such that $d_1-d_2$ is greater than 5 $\mu$m and less than 150 $\mu$m—although this last constraint may not always be necessary, depending on various densities and strengths. In one embodiment, $d_1-d_2$ is approximately 30 $\mu$m. The axial dimensions for this single-chamber cell are normally such that the sample chamber is centered within the ceramic rotor. Of course, both the cell and the plug must be substantially impermeable (non-porous) and have low moisture absorption for most applications. Teflon (poly-$CF_4$) satisfies the plug requirements for almost all liquid samples of interest. Even though teflon is normally considered impermeable and has relatively low moisture absorption, it is generally necessary to dry it with an extended vacuum bake-out after final machining for satisfactory performance in proton NMR.

With kel-f cells inside thin zirconia shells driven by kel-f turbine caps, 5 mm rotors containing 100 microliter plastic cells may be spun up to 10 kHz. With polyimide (PI) turbine caps and slightly thicker silicon nitride shells, the kel-f sealing cell may be spun over 18 kHz. This represents a dramatic increase over prior art HR MAS spinning rates of 2 to 3 kHz.

For fluorine NMR, the plastic cell may be from a side variety of plastics—including thermoplastic polyimides and polyetheretherketon (PEEK). Ideal material choices for the semi-compliant, non-fluorinated, solvent-resistant, high-density plug 23 are not readily available, but satisfactory materials for many applications include polyphenylene sulfide (PPS) and filled silicone rubber, although the former is too hard for convenient sealing in many cases and the latter does not have sufficient strength for spinning at the highest speeds. Polypropylene (PP) is suitable for very-low-density solvents, and a large number of plasticized polymers (especially polyvinyl chloride, PVC) are suitable for many solvents. See Table 1 for some relevant materials data.

With larger volume cells and low viscosity sample solvents, it is possible to excite various circulation and vibrational modes within the sample, especially when a bubble vortex is present, as is normally the case, at rotational rates as low as 2 kHz. Such resonances defeat the MAS technique by causing the spins to execute non-circular paths about the magic angle spinning axis. FIG. 3 illustrates the use of a pointed plug 33 extending into the sample, which has been found to be extremely effective in suppressing vortex resonances in most cases. Such a geometry results in considerable degradation of NMR lineshape for a non-spinning sample at the magic angle, all inhomogeneities from any cylindrically symmetric susceptibility discontinuity, even a point, average to zero. The cell 31 may also be formed with a reverse taper in its bottom in place of, or in addition to, the pointed plug. Reverse ellipsoids of revolution are also beneficial in suppressing vortex resonances, and ridges 37, 38 or grooves on the inside surface of the cell are also beneficial in suppressing axial resonances.

FIG. 4 illustrates a dual-chamber NMR MAS sealing cell 41 for use inside a ceramic rotor sleeve (as above) to permit effective external lock. The sample chamber 44 is normally the larger chamber and axially centered. It is sealed by compliant plug 43 at one end. The smaller chamber 49 near the opposite end is available to contain a reference sample, such as $D_2O$, for lock and is sealed with compliant plug 46. This allows field stabilization via a lock reference signal without the use of deuterated solvents in the sample. In this sense, this would most aptly be described as an external lock. However, prior art external lock arrangements in conventional high-resolution probes normally required the reference sample to be 10 to 20 mm from the sample in order to avoid disturbing $B_0$ field homogeneity at the sample, as susceptibility discontinuities are unavoidable. With such a large displacement between the sample and the reference, performance was generally unsatisfactory, both because of poor reference resolution and the inability to correct for drift in shim gradients from the large distance. Consequently, all modern high-resolution probes rely on internal lock. This has several undesirable consequences. First of all, maintaining an inventory of a large number of highly deuterated solvents is quite costly—usually the most expensive maintenance cost in running a spectrometer. Secondly, deuteration of the sample is at best convenient and, especially with small samples where very high deuteration is needed, may affect the spectra and its interpretation. One method of avoiding these problems in conventional probes is to place the lock reference inside a small tube coaxially within the larger sample tube, but such an arrangement is fraught with difficulties related to contamination, filling factor, centering, and spinning sidebands.

The dual-chamber cell of FIG. 4 blurs the distinction between internal and external lock. MAS allows the lock reference to be within 0.5 mm of the sample with non degradation in $B_0$ homogeneity, regardless of susceptibilities. The reference is indeed external to the sample, but its proximity makes it perform more like an internal lock from an rf and shimming perspective. Normally, both the lock reference and the sample will see both rf fields.

While the primary application of the dual-chamber MAS cell is expected to be for external lock in HR MAS, it may also be used for temperature calibration by using a reference sample with a known temperature-dependent chemical shift such as $Pr_2Sn_2O_7$, $Sm_2Sn_2O_7$, or $Pb(NO_3)_2$, as described by Bielecki and Burum. It may also be used for both purposes at once and possibly for other purposes.

An even more desirable method to achieve external lock may be to use two single-chamber cells similar to that of FIG. 3, except with minimum bottom thickness. The two cells, perhaps one larger for the NMR sample and one small for the lock reference, could both be inserted inside the ceramic rotor 22 with their plugs 33 facing opposite directions to permit minimal separation between the two samples.

TABLE 1

Materials Data

| Material | Dens. | Young's mod. | Yield strength | Elong. | Therm. expan. | Magn. suscept. |
|---|---|---|---|---|---|---|
| Symbol | $\rho$ | Y | S | $\delta$ | $b_\tau$ | $X_v$ |
| Units | kg/m$^3$ | GPa | MPa | % | $10^8$/K | $10^{-6}$ |
| $Al_2O_3$ | 3,950 | 390 | 240 | 0.05 | 8 | −14 |
| Aurum (PI) | 1,330 | 3 | 70 | 90 | 55 | −8.9 |
| Forsterite | 2,800 | 150 | 120 | 0.1 | 10.5 | 8 |
| Kel-F | 2,100 | 1.3 | 20 | 50 | 60 | −11.6 |
| Macor | 2,520 | 64 | 80 | 0.2 | 9 | −11.7 |
| MgO | 3,400 | 250 | 100 | 0.03 | 13.5 | −17.8 |
| PEEK | 1,300 | 3.8 | 70 | 60 | 54 | −9.3 |
| PP | 905 | 1 | 23 | 200 | 70 | −9.3 |
| PPS | 1,350 | 2.7 | 60 | 25 | 50 | −9.2 |
| PVC (Type II) | 1,400 | 2 | 25 | 50 | 90 | |
| PSZ | 5,700 | 200 | 500 | 0.3 | 9.5 | −8.8 |
| Pyrex-7070 | 2,500 | 70 | 40 | 0.1 | 3.3 | −11 |
| Silicone (Filled) | 1.8 | 1 | 6 | 300 | 40 | |
| $Si_3N_4$ (HIP'd) | 3,250 | 310 | 750 | 0.2 | 3.2 | −14.0 |
| Teflon | 2,200 | 0.4 | 12 | 300 | 120 | −10.5 |
| Ultem | 1,270 | 2.7 | 95 | 60 | 55 | 9.0 |

What is claimed is:

1. A cylindrical MAS sample container for use inside a ceramic MAS rotor shell having precision inside diameter $d_5$, said container further characterized as comprising
   a cell of a first material of substantially uniform outside diameter $d_4$, where $d_5-d_4$ is positive and less than 50 microns, said cell further comprising a sample chamber with a concentric cylindrical opening at one end having inside diameter $d_2$,
   a compliant sealing plug of a second material comprising a cylindrical plug of outside diameter $d_1$, where $d_1-d_2$ is greater than 5 microns and less than 150 microns,
   said first material further characterized as having Young's modulus $Y_1$, tensile strength $S_1$, and density $p_1$,
   said second material further characterized as having Young's modulus $Y_2$, tensile strength $S_2$, and density $p_2$,
   said materials further characterized as being substantially impermeable and having the following characteristics: $Y_1>0.8$ GPa, $S_1>8$ MPa, $S_2>3$ MPa, $p_2$ 880 kg/m$^3$, and $p_2/Y_2>p_1/Y_1$.

2. The container of 1 where $d_1-d_2$ is greater than $d_5-d_4$.
3. The container of 1 wherein $Y_1<4$ GPa and $Y_2<3.4$ GPa.
4. The container of 1 for use with a sample of density $p_4$, where $p_4<p_2$.
5. The container of 1 wherein said plug is further characterized as including a conical end.
6. The container of 1 wherein said sample chamber is further characterized as including circumferential grooves or ridges on its inside cylindrical surface.
7. The container of 1 wherein $d_5-d_4$ is approximately 15 microns.
8. The container of 1 wherein $d_1-d_2$ is approximately 30 microns.
9. The container of 1 where said first material is kel-f and said second material is teflon.
10. The container of 1 where said first material is either a polyimide or polyether-etherketone and said second material is either polyvinyl chloride or polyphenylene sulfide.
11. A cylindrically symmetric MAS NMR sample container comprising a cell of a first material with Young's modulus $Y_1$, tensile strength $S_1$, and density $p_1$, with opening diameter $d_2$ and a polymeric stopper of a second material of Young's modulus $Y_2$, tensile strength $S_2$, and density $p_2$, said container further characterized as defining a sample region of diameter $d_3$ for a substantial portion of said region, said region further characterized as being axially shorter for small sample radii than for large sample radii, said materials further characterized as being substantially impermeable and having the following characteristics: $Y_1>0.8$ GPa, $Y_2<3.4$ GPa, $S_1>8$ MPa, $S_2>3$ MPa, $p_2>880$ kg/m$^3$, and $p_2/Y_2>p_1/Y_1$.
12. A sample container as in 11 wherein said stopper includes a plug with diameter $d_1$ such that $d_1-d_2$ is greater than 5 microns and less than 150 microns.
13. The container of 12 wherein $d_1-d_2$ is approximately 30 microns.
14. The container of 11 wherein said plug is further characterized as including a conical end.
15. The container of 11 where said first material is kel-f and said second material is teflon.
16. The container of 11 where said first material is either a polyimide or polyether-etherketone and said second material is either polyvinyl chloride or polyphenylene sulfide.
17. A cylindrically symmetric MAS NMR sample container comprising a cell of a first material with Young's modulus $Y_1$, tensile strength $S_1$, and density $p_1$, with opening diameter $d_2$ and a polymeric stopper of a second material of Young's modulus $Y_2$, tensile strength $S_2$, and density $p_2$, said container further characterized as defining a sample region of minor diameter $d_3$ over a portion of said region, said region further characterized as including circumferential grooves with major diameter $d_4$ greater than $d_3$, said materials further characterized as being substantially impermeable and having the following characteristics: $Y_1>0.8$ GPa, $Y_2<3.4$ GPa, $S_1>8$ MPa, $S_2>3$ MPa, $p_2>880$ kg/m$^3$, and $p_2/Y_2>p_1/Y_1$.
18. A sample container as in 17 wherein said stopper includes a plug with diameter $d_1$ such that $d_1-d_2$ is greater than 5 microns and less than 150 microns.
19. The container of 18 wherein $d_1-d_2$ is approximately 30 microns.
20. The container of 17 wherein said plug is further characterized as including a conical end.
21. The container of 17 where said first material is kel-f and said second material is teflon.
22. The container of 17 where said first material is either a polyimide or polyether-etherketone and said second material is either polyvinyl chloride or polyphenylene sulfide.

23. A cylindrical MAS dual-chamber sample container for use inside a ceramic MAS rotor shell having precision inside diameter $d_5$, said container further characterized as comprising

- a cell of a first material of substantially uniform outside diameter $d_4$, where $d_5-d_4$ is positive and less than 50 microns, said cell further comprising two isolated sample chambers with concentric cylindrical openings at opposite ends,
- two compliant sealing stoppers of a second material,
- said first material further characterized as having Young's modulus $Y_1$, tensile strength $S_1$, and density $p_1$,
- said second material further characterized as having Young's modulus $Y_2$, tensile strength $S_2$, and density $p_1$,
- said materials further characterized as being substantially impermeable and having the following characteristics: $Y_1>0.8$ GPa, $Y_2<3.4$ GPa, $S_1>8$ MPa, $S_2>3$ MPa, $p_2>880$ kg/m$^3$, and $p_2/Y_2>p_1/Y_1$.

24. In an HR MAS NMR experiment, spinning two separate, cylindrically symmetric, sealed containers, one of which contains a deuterated solvent, simultaneously inside a ceramic rotor.

* * * * *